United States Patent
Zundel et al.

(10) Patent No.: US 9,570,433 B2
(45) Date of Patent: *Feb. 14, 2017

(54) SEMICONDUCTOR DEVICE AND METHOD FOR MANUFACTURING A SEMICONDUCTOR DEVICE

(71) Applicant: Infineon Technologies AG, Neubiberg (DE)

(72) Inventors: Markus Zundel, Egmating (DE); Vanessa Capodieci, Munich (DE); Markus Dinkel, Unterhaching (DE); Uwe Schmalzbauer, Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/859,928

(22) Filed: Sep. 21, 2015

(65) Prior Publication Data
US 2016/0013176 A1    Jan. 14, 2016

Related U.S. Application Data (63) Continuation of application No. 13/752,670, filed on Jan. 29, 2013, now Pat. No. 9,171,777, which is a (Continued)

(51) Int. Cl.
*H01L 27/02* (2006.01)
*H01L 23/48* (2006.01)
(Continued)

(52) U.S. Cl.
CPC .......... *H01L 27/0207* (2013.01); *G01R 31/26* (2013.01); *H01L 22/34* (2013.01); *H01L 23/48* (2013.01);
(Continued)

(58) Field of Classification Search
None
See application file for complete search history.

(56) References Cited

U.S. PATENT DOCUMENTS 9,171,777 B2 * 10/2015 Zundel .................. H01L 23/585
2002/0078409 A1    6/2002 Marshall et al.
(Continued)

FOREIGN PATENT DOCUMENTS

| CN | 1378266 A1 | 11/2002 |
| CN | 101123218 A | 2/2008 |

(Continued)

OTHER PUBLICATIONS

U.S. Appl. No. 13/719,599, filed Dec. 19, 2012.
(Continued)

*Primary Examiner* — Fernando L Toledo
*Assistant Examiner* — Valerie N Newton
(74) *Attorney, Agent, or Firm* — Eschweiler & Associates, LLC (57) ABSTRACT

A semiconductor device includes a semiconductor substrate including a main surface with a polygonal geometry and a main electric circuit manufactured within a main region on the semiconductor substrate. The main electric circuit is operable to perform an electric main function. The main region extends over the main surface of the semiconductor substrate leaving open at least one corner area at a corner of the polygonal geometry of the main surface of the semiconductor substrate. The corner area extends at least 300 μm along the edges of the semiconductor substrate beginning at the corner.

20 Claims, 5 Drawing Sheets

Related U.S. Application Data continuation-in-part of application No. 13/719,599, filed on Dec. 19, 2012, now abandoned.

(51) Int. Cl.

| | | |
|---|---|---|
| *H01L 23/58* | (2006.01) | |
| *H01L 21/66* | (2006.01) | |
| *H01L 29/40* | (2006.01) | |
| *H01L 29/78* | (2006.01) | |
| *H01L 23/00* | (2006.01) | |
| *G01R 31/26* | (2014.01) | |
| *H01L 27/088* | (2006.01) | |
| *H01L 29/06* | (2006.01) | |
| *H01L 23/13* | (2006.01) | |

(52) U.S. Cl.
CPC ............ *H01L 23/562* (2013.01); *H01L 23/58* (2013.01); *H01L 23/585* (2013.01); *H01L 27/088* (2013.01); *H01L 29/0692* (2013.01); *H01L 29/40* (2013.01); *H01L 29/407* (2013.01); *H01L 29/7811* (2013.01); *H01L 29/7813* (2013.01); *H01L 23/13* (2013.01); *H01L 2924/0002* (2013.01)

(56) References Cited

U.S. PATENT DOCUMENTS

| | | |
|---|---|---|
| 2002/0088973 A1 | 7/2002 | Susami |
| 2007/0023915 A1 | 2/2007 | Jao et al. |

FOREIGN PATENT DOCUMENTS

| | | |
|---|---|---|
| CN | 101794777 A | 8/2010 |
| CN | 102117805 A | 7/2011 |
| CN | 102129169 A | 7/2011 |

OTHER PUBLICATIONS

"Fairchild Semiconductor FDB9403_F085 N-Channel Power Trench MOSFET 40V, 110A, 1.2m"; Fairchild Semiconductor Corporation, www.fairchildsemi.com; published in 2012, p. 1-6.

"Vishay Siliconix N-Channel 100 V (D-S) MOSFET"; Vishay; www.vishay.com; Nov. 22, 2010, p. 1-7.

Non-Final Office Action dated Dec. 6, 2013 for U.S. Appl. No. 13/752,670.

Non-Final Office Action dated Sep. 4, 2014 for U.S. Appl. No. 13/752,670.

Final Office Action dated Mar. 30, 2015 for U.S. Appl. No. 13/752,670.

Notice of Allowance dated Jun. 22, 2015 for U.S. Appl. No. 13/752,670.

\* cited by examiner

SEMICONDUCTOR DEVICE AND METHOD FOR MANUFACTURING A SEMICONDUCTOR DEVICE

REFERENCE TO RELATED APPLICATIONS

This Application is a continuation of U.S. application Ser. No. 13/752,670 filed on Jan. 29, 2013, which is a Continuation-In-Part of U.S. application Ser. No. 13/719,599 filed on Dec. 19, 2012, the contents of which are incorporated by reference in their entirety.

FIELD

Embodiments relate to semiconductor-based electric circuits and in particular to a semiconductor device and a method for manufacturing a semiconductor device.

BACKGROUND

A semiconductor device is often exposed to high temperatures and varying pressures during the manufacturing process. Also during the separation of chips on a thin wafer by sawing methods there exists the risk of generating slight pre-damages at the silicon side wall of chips unintentionally. At such positions, a development or a propagation of long-reaching cracks within the silicon may occur during the further processing of packaging the chips due to additional temperature load and stress load. Such cracks may lead to malfunctions or breakdowns. It is desired to avoid such electrical breakdowns.

SUMMARY

A semiconductor device according to an embodiment comprises a semiconductor substrate comprising a main surface with a polygonal geometry and a main electric circuit manufactured within a main region on the semiconductor substrate. The main electric circuit is operable to perform an electric main function. The main region extends over the main surface of the semiconductor substrate leaving open at least one corner area at a corner of the polygonal geometry of the main surface of the semiconductor substrate. The corner area extends at least 300 μm along the edges of the semiconductor substrate beginning at the corner.

Embodiments may be based on the finding that cracks within the semiconductor substrate caused by different kinds of loads during the manufacturing process may reach a main surface of the semiconductor often in the proximity of the corners of the semiconductor device. Malfunctions and/or breakdowns of semiconductor devices can be avoided by leaving open the corner area from elements of the main electric circuit so that the main electric function of the semiconductor device is significantly less endangered by these cracks. In this way, the reliability and/or the production yield can be also improved.

In some embodiments, the semiconductor device may comprise an electric test circuit manufactured within the at least one corner area on the semiconductor substrate. This electric test circuit is operable to enable an electric test function. In this way, the space of the corner area can be used for structures for test measurements (e.g. ON-state resistance). However, cracks within the corner area may not lead to malfunctions or breakdown of the main electric circuit so that the semiconductor device may be still usable. Further, the corner area may not be wasted space in this case.

In some embodiments, all electrically conductive structures manufactured within the corner area on the semiconductor substrate are electrically connected to the semiconductor substrate or electrically isolated so that in an operating state of the semiconductor device each of the electrically conductive structures either comprises basically the same electric potential as the semiconductor substrate or is electrically floating. In this way, shorts caused by cracks may be avoided.

Some embodiments relate to a power semiconductor device comprising a semiconductor device according to the described concept with at least one active element of the main electric circuit comprising a breakdown voltage higher than 10 V.

BRIEF DESCRIPTION OF THE DRAWINGS

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
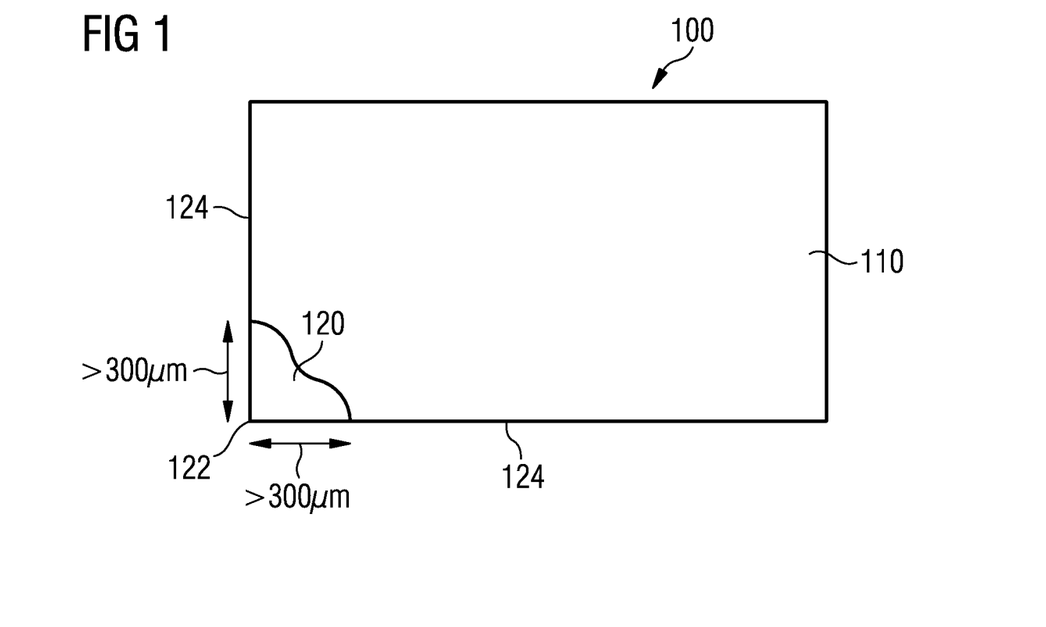
FIG. 1 shows a schematic bird's eye view of a semiconductor device.

FIG. 1 shows a schematic illustration of a semiconductor device 100 according to an embodiment. The semiconductor device 100 comprises a semiconductor substrate. This semiconductor substrate comprises a main surface with a polygonal geometry. Further, the semiconductor device 100 comprises a main electric circuit manufactured within a main region 110 on the semiconductor substrate. The main electric circuit is operable to perform an electric main function of the semiconductor device 100. The main region 110 extends over the main surface of the semiconductor substrate leaving open at least one corner area 120 at the corner 122 of the polygonal geometry of the main surface of the semiconductor substrate. The corner area 120 extends at least 300 µm along the edges 124 of the semiconductor substrate beginning at the corner 122.

During the manufacturing process of the semiconductor device 100 (e.g. wafer sawing and packaging afterwards) various kinds of stress are applied to the semiconductor device 100. The stress may result in cracks in the semiconductor substrate. For example, these cracks may arise typically in the proximity of the back side and often stay there (e.g. depending on the type of package and/or the type of semiconductor device). Due to different kinds of stress conditions, particularly close to the chip corner (corner 122 of the semiconductor substrate), these cracks may be deflected to the surface (the main surface of the semiconductor substrate) within the chip corner area (corner area 120 of the semiconductor substrate). Most of these cracks occur at the main surface of the semiconductor substrate within a range of 300 µm from the corner of the semiconductor substrate. By leaving open the corner area 120, malfunctions and/or breakdowns within the active chip region (main region 110 of the semiconductor substrate) caused by such cracks can be avoided. Further, the yield and/or the availability of the semiconductor device 100 may be improved.

The semiconductor substrate may be the bulk material on which electric circuits (e.g. the main electric circuit) are manufactured. For example, the semiconductor substrate may comprise any semiconductor material (e.g. silicon or gallium arsenide), depending on the kind of semiconductor device. The semiconductor substrate may have been part of a wafer during the front end manufacturing of the semiconductor device 100 and may have been separated from other semiconductor devices afterwards. The semiconductor substrate may comprise a basic doping (e.g. n or p doping).

The main surface of the semiconductor substrate may be the surface the main electric circuit is manufactured on. This main surface comprises a polygonal geometry (e.g. a rectangle, a square or a triangle).

The main electric circuit enables the electric main function of the semiconductor device 100. Depending on the kind of semiconductor device, the main electric circuit may comprise an arbitrary number and/or arbitrary types of electrically active and/or passive elements. For example, the main electric circuit may comprise a single transistor (e.g. power semiconductor device) or may be a highly-complex circuitry with analog (e.g. charge pumps, phase locked loops and/or amplifiers) and/or digital (e.g. arithmetic logic units) parts as well as different functional blocks as memory blocks, analog-digital converters and/or input-output interfaces or any other circuit, for example. However, electric test circuits (e.g. for ON-state resistant measurements) for production tests or monitoring may not be part of the main electric circuit, since these electric test circuits may not contribute to the execution of the electric main function of the semiconductor device 100.

The main electric circuit is manufactured on the semiconductor substrate. This may mean that elements of the main electric circuit are manufactured on top of the main surface of the semiconductor substrate (e.g. transistor gates, contacts or metal layers). However, it may also include elements manufactured into the semiconductor substrate starting from the surface (e.g. trenches, gate oxide, implanted wells or other implant regions different from the basic implant of the semiconductor substrate). In other words, the main electric circuit is manufactured on the semiconductor substrate and may comprise structures ranging from the implant regions (e.g. active areas, gates, contacts) to the metal layers above the semiconductor substrate.

The main electric circuit is manufactured within the main region 110. In other words, the main region 110 contains the elements of the main electric circuit manufactured on the semiconductor substrate. However, the semiconductor substrate itself may also be used as an electrode (e.g. bulk electrode or back side drain electrode) and may be in these terms part of the main electric circuit. Nevertheless, the semiconductor substrate is obviously manufactured on the semiconductor substrate so that the semiconductor substrate may be a part of the main electric circuit although it may also extend through the corner areas 120.

The main region 110 leaves open at least one corner area 120. In other words, the main region 110 may extend over the whole main surface of the semiconductor substrate with the exception of the at least one corner area 120 as well as optionally each further corner area, for example.

The corner area 120 contains a corner 122 of the polygonal geometry and extends at least 300 µm along the edges 124 of the semiconductor substrate beginning at the corner 122. In other words, the corner area 120 is bordered at two sides by the edges 124 of the semiconductor substrate beginning at the corner 122 of the corner area 120. In this way, a corner 122 of the polygonal geometry can be defined as the origin of the corner area 120 and the two edges 124 of the semiconductor substrate meeting each other at the corner 122 form borders of the corner area 120 at two sides of the corner area 120. These sides of the corner area 120 extend at least 300 µm along the edges 124 starting at the corner 122.

Figure 2:
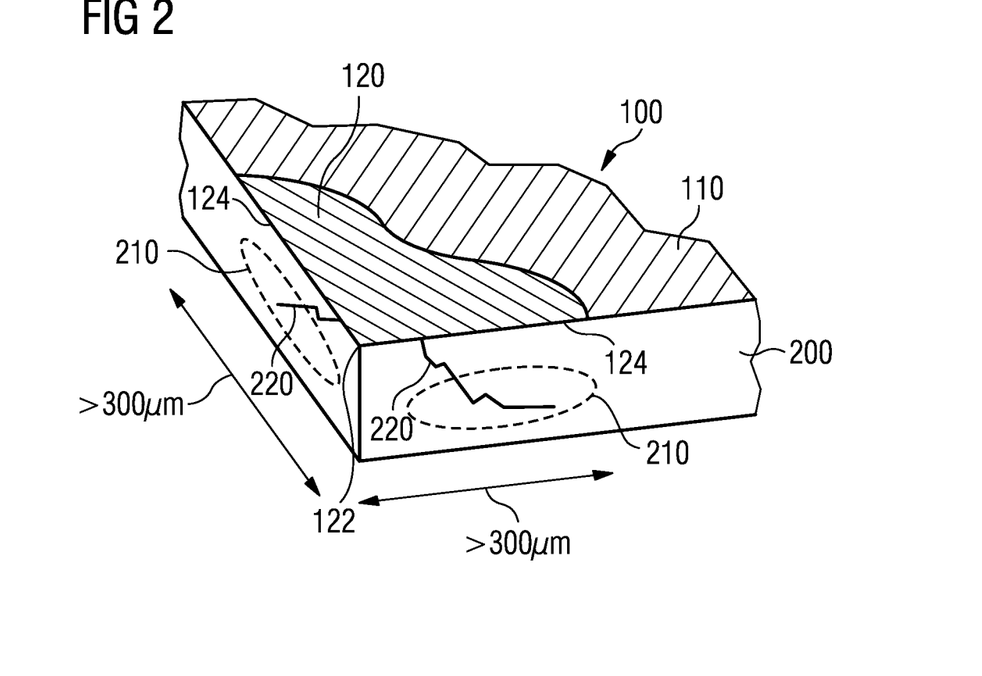
FIG. 2 shows a schematic illustration of a corner area of a semiconductor device.

FIG. 2 shows a detailed view of a corner area 120. The back side of the semiconductor substrate 200 in the proximity of the corners 122 of the semiconductor substrate 200 may be a region of enhanced stress 210 during manufacturing. In these regions of enhanced stress 210, the generation of cracks 220 may be more likely than in other regions of the semiconductor substrate. These cracks 220 may tend to propagate to the main surface of the semiconductor substrate 200 under temperature load and/or stress load (e.g. after wafer sawing during packaging). Most of these cracks 220 reach the main surface of the semiconductor substrate 200 within a distance of less than 300 µm away from a corner 122 of the semiconductor substrate 200. Therefore, manufacturing the main electric circuit of the semiconductor device 100 away from the corner 122 may result in a reduced number of malfunctions and/or breakdowns and in an improved yield and/or reliability of the semiconductor device 100.

Figure 4:
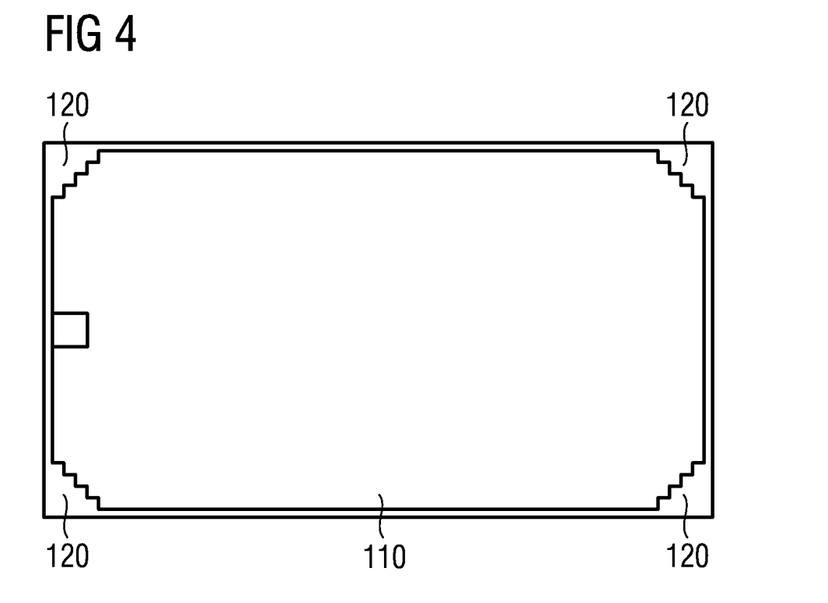
FIG. 4 shows a schematic bird's eye view of another semiconductor device.

It may be sufficient to leave open only one corner area 120 at one corner 122 of the polygonal geometry although the polygonal geometry of the main surface of the semiconductor substrate comprises more than one corner, since some parts of the main electric circuit may be more sensitive to cracks than others so that on the one hand the most sensitive parts may be protected by leaving open corner areas neighboring such parts and on the other hand not too much area of the semiconductor substrate is wasted. However, optionally, a corner region may be left open at each corner of the polygonal geometry. In other words, the main region 110 may extend over the main surface of the semiconductor substrate leaving open a corner area 120 at every corner 122 of the polygonal geometry of the main surface of the semiconductor substrate. Each corner area 120 may extend at least 300 µm along the edges of the semiconductor substrate beginning at their respective corners, as it is shown in FIG. 4, for example.

Figure 3:
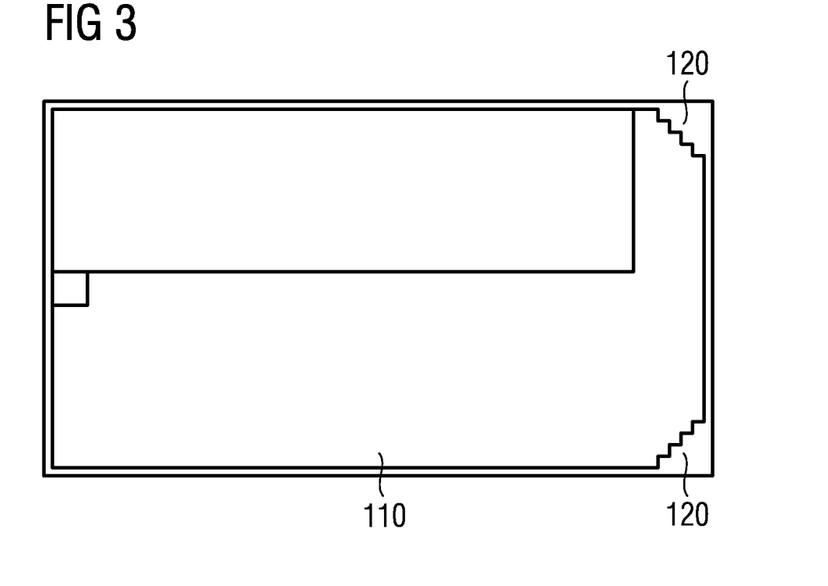
FIG. 3 shows a schematic bird's eye view of a semiconductor device.

Alternatively, also more than one corner area 120 at more than one corner 122 but not at every corner of the polygonal geometry may be left open as it is shown in FIG. 3, for example.

The semiconductor substrate and the main region 110 may be of any size. However, since the corner area 120 may occupy a significant portion of the main surface of the semiconductor substrate, the main region 110 may be larger than 5 mm² (or larger than 12 mm², 20 mm² or 25 mm²).

In the following, optional aspects may be described for one corner area 120. However, this aspects may be realized for more than one or all corners of the polygonal geometry.

Optionally, in order to further reduce the risk of malfunctions and/or breakdowns of the semiconductor device 100, the corner area 120 may be extended. For example, the corner area 120 may extend at least 500 µm along the edges of the semiconductor substrate beginning at the corner 122. Since no (or not yet) cracks have been detected caused by the described mechanism reaching the main surface of the semiconductor substrate, more than 500 µm away from a corner 122 of the semiconductor substrate, the risk of malfunctions and/or breakdowns of semiconductor devices due to this failure type may be significantly reduced. For safety reasons, the corner area 120 may be further enlarged. For example, the corner area 120 may extend at least 750 µm along the edges of the semiconductor substrate beginning at the corner 122. However, this also significantly reduces the area available for the main electric circuit. So it may depend on the application whether safety reasons are more important than area consumption reasons.

Since the expansion of the corner area 120 along the edges 124 of the semiconductor substrate may not directly influence the total area covered by the corner area 120, since the edges 124 limit the corner area 120 only at two sides. Therefore, a minimum area for the corner area 120 may optionally be defined. For example, the corner area 120 may extend at least 300 µm along the edges 124 of the semiconductor substrate beginning at the corner 122 and extend over more than 100000 µm² of the main surface of the semiconductor substrate. In other words, the at least one corner area 120 may extend over more than 100000 µm² (or more than 200000 µm², more than 0.5 mm² or more than 1 mm²).

Figure 5:
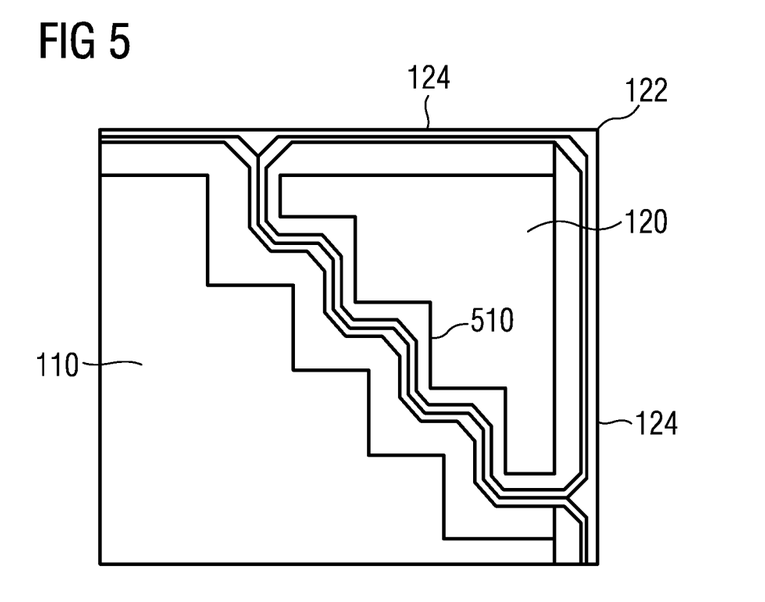
FIG. 5 shows a schematic illustration of a corner area.

The at least one corner area 120 is bordered at two sides by the edges 124 of the semiconductor substrate. However, the at least one other side may comprise an arbitrary shape. Nevertheless, it may cover enough area to prevent the main electric circuit of being too close to the corner area 120 with enhanced crack risk. Therefore, optionally, the at least one corner area 120 may extend at least over a triangle with a corner of the at least one corner area 120 being a corner of the triangle and the edges 124 of the semiconductor substrate comprised by the at least one corner area 120 being edges of the triangle. The third edge of the triangle may connect points at least 300 µm along the edges 124 away from the corner 122, for example. In this way, also inside the main surface of the semiconductor substrate, the main electric circuit may be sufficiently spaced away from the corner 122. However, the corner area 120 may comprise also another geometric shape. For example, FIG. 5 shows a stepped shape side 510 of a corner area 120 connecting points of the corner area 120 at least 300 µm along the edges 124 away from the corner 122.

The semiconductor substrate can be of any thickness. However, the probability of cracks occurring due to the described effect may increase with decreasing thickness of the semiconductor substrate. Depending on the kind of semiconductor device and its application, the semiconductor substrate may comprise a thickness of less than 120 µm (or less than 100 µm or less than 80 µm or less than 50 µm).

The main electric circuit may be completely manufactured within the main region 110 or may be manufactured solely within the main region 110. In other words, the main electrical circuit may comprise all elements manufactured on the semiconductor substrate necessary to provide the full functionality of the semiconductor device in an operating state (e.g. power transistor together with logic circuits for a smart power semiconductor device). However, as already mentioned, the main electric circuit may use the semiconductor substrate as an electrode. In other words, the main electric circuit may be manufactured completely within the main region 110 on the semiconductor substrate and may be configured to use the semiconductor substrate as an electrode. In this way, only this electrode may be affected by a crack in the corner area 120 so that shorts to other elements of the main electric circuit can be avoided.

For example, the semiconductor substrate may represent a bulk electrode of at least one element (e.g. a transistor) of the main electric circuit or more represent a drain electrode of at least one element (e.g. power transistor) of the main electric circuit. In this way, for example power transistors as well as logic transistors can be realized with significantly reduced risk of a malfunction or a breakdown due to cracks at the corner region.

Optionally, the electrode represented by the semiconductor substrate may be realized at an opposite surface of the main surface of the semiconductor substrate and may be configured to be used as a back side contact for at least one element of the main electric circuit. Alternatively, the electrode represented by the semiconductor substrate may be connectable from the main surface of the semiconductor substrate. In this way, a large variety of semiconductor devices can be realized.

The space of the corner area 120 may be left empty (without electrically conductive structures) or may be filled with dummy structures or may be used for implementing electric test circuits, for example.

In one example, the semiconductor device 100 may further comprise an optional electric test circuit manufactured within the at least one corner area 120 on the semiconductor substrate. The electric test circuit may be operable to enable an electric test function. This electric test function may be executable independently from the electric main function. In other words, the corner area 120 may be used to implement test structures (e.g. for production tests or production monitoring). Optionally, the electric test circuit may (also) use the semiconductor substrate as an electrode, for example.

Depending on the kind of semiconductor device and/or the application different electric test circuits may be implemented. For example, the electric test circuit may be operable to enable an ON-state resistance measurement of the semiconductor substrate or a gate oxide breakdown voltage measurement.

Alternatively, the semiconductor device 100 may further comprise optionally an electric dummy structure manufactured within the at least one corner area 120 on the semiconductor substrate. In this connection, electrically conductive structures of the electric dummy structure may be electrically connected to the semiconductor substrate or electrically isolated so that in an operating state of the semiconductor device 100 each of the electrically conductive structures of the electric dummy structure may either comprise basically the same electric potential as the semiconductor substrate (e.g. with a tolerance of less than 30%, less than 20% or less than 10% of the electric potential of the semiconductor substrate) or may be electrically floating (isolated from other conductive structures). In other words, electrically conductive structures implemented for increasing the structural homogeneity of the corner area 120 compared to the main region 110 may be floating or at the same electrical potential as the semiconductor substrate so that shorts between electrically-conductive structures with different electrical potential due to cracks can be avoided.

For the same reason, for example, optionally all electrical conductive structures manufactured within the corner area 120 on the semiconductor substrate may be electrically connected to the semiconductor substrate or electrically isolated so that in an operating state of the semiconductor device each of the electrically conductive structures either comprises basically the same electric potential as the semiconductor substrate or may be electrically floating. In this way, the possibility of shorts due to cracks caused by the described effect can be significantly reduced.

A semiconductor device 100 may comprise within the corner area 120 only electric test structures or only electric dummy structures or alternatively at least one electric test circuit and electric dummy structures.

As mentioned, the corner area 120 can also be left empty. However, in order to increase the structural homogeneity between the corner area 120 and the main region 110 with the main electric circuit, similar structures may be realized within the corner area 120 and the main region 110.

Figure 6:
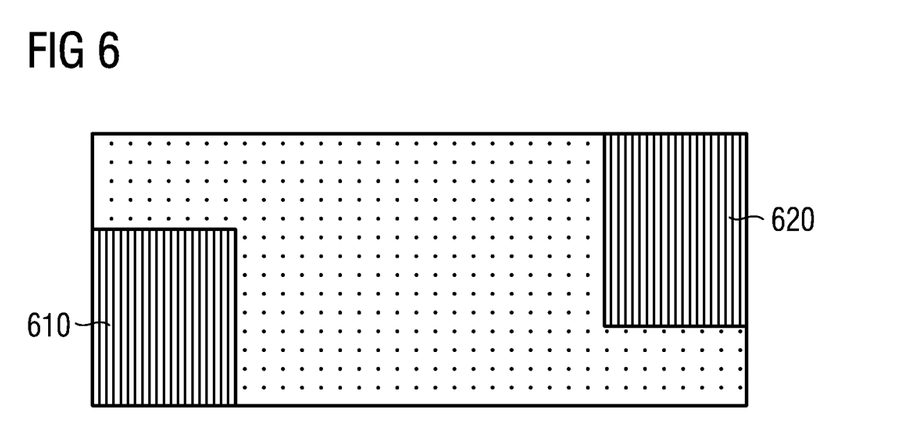
FIG. 6 shows a schematic illustration of trenches within a main region and within a corner area on the semiconductor substrate of a semiconductor device.

For example, the main region 110 and the at least one corner area 120 may comprise structures fabricable or fabricated by using at least the same trench etch process. A trench etch process may generate a large topology or unevenness (e.g. surface with varying height) on the surface of the semiconductor substrate which may lead to stress. By increasing the homogeneity of the distribution of the trenches, the stress may be reduced. An example for similar trench structures manufactured by the same trench etch process is shown in FIG. 6. In the lower left corner, parallel trenches 610 within the main region 110 are neighboring parallel trenches 620 within the corner region 120 in the upper right corner.

Optionally, alternatively or additionally, the main region 110 and the at least one corner area 120 may comprise structures fabricable or fabricated by using at least a same trench oxidation process. In this way, a homogenous oxidation layer may be manufactured within both areas so that the stress between the semiconductor substrate and the oxidation layer might be reduced, for example.

Optionally, alternatively, or additionally, the main region 110 and the at least one corner area 120 may comprise structures fabricable or fabricated by using at least a same polysilicon fill process. For example, trenches may be filled by polysilicon. If trenches within both regions may be filled by the same polysilicon fill process, the homogeneity within the areas can be increased and stress may be reduced.

Figure 7:
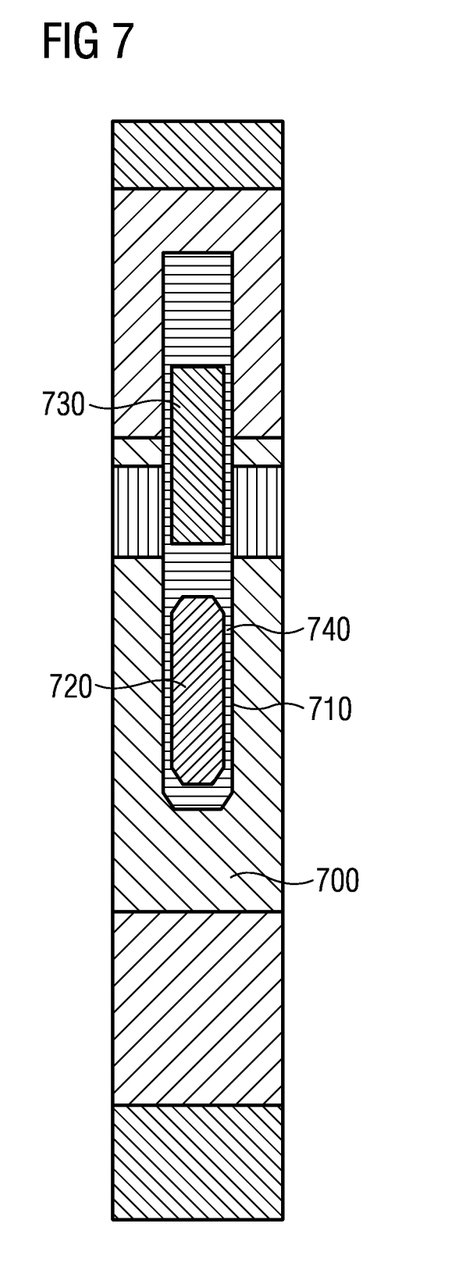
FIG. 7 shows a schematic cross section of a transistor of a semiconductor device.

An example for similar structures within the main region 110 and the corner area 120 is shown in FIG. 7. FIG. 7 shows a schematic cross section of a trench 710 within the main region 110. The trench may be filled by a first polysilicon fill 720 separated by an oxide layer from a second polysilicon fill 730. Further, an oxide layer 740 is located between the semiconductor substrate 700 and the polysilicon fill 720, 730. For example, the structure may realize a transistor for a power semiconductor device. In this example, the first polysilicon fill 720 may be a source electrode, the second polysilicon fill 730 may be a gate electrode and the semiconductor substrate 700 may represent a drain electrode of the transistor. The semiconductor device may comprise a large number of such structures in parallel. Similar or equal structures may be comprised by the corner region 120 resulting in a high homogeneity. The transistor structures contained by the corner area 120 may comprise source electrodes connected to the semiconductor substrate (representing the drain electrode) to avoid different electric potentials within the corner area 120.

For example, in connection with an electric test circuit, the main electric circuit may comprise at least one metal-oxide-semiconductor-field-effect-transistor (MOSFET) structure and the electric test circuit may comprise at least one MOSFET structure. The MOSFET structure of the main electric circuit and the MOSFET structure of the electric test circuit may be fabricable or fabricated simultaneously by the same manufacturing processes. In this way, the homogeneity within the main region 110 and a corner area 120 may be increased.

Further optionally, also the topology or unevenness of the main surface may be more homogeneous, if the corner area 120 may also comprise a similar metal occupancy density compared to the main region 110 within the upper layers. In other words, the main region 110 and the at least one corner area 120 may comprise at least one metal layer comprising a same metal occupancy density with a tolerance of less than 20% (or less than 10% or less than 1%) of a metal occupancy. A metal layer comprises areas filled with metal (e.g. copper or aluminum) and areas filled with insulator (e.g. silicon dioxide). The metal occupancy density may be a ratio between areas filled with metal and areas filled with insulator within the metal layer.

Some examples relate to a semiconductor device comprising a semiconductor substrate and electrical conductive structures. The semiconductor substrate comprises a main surface with a polygonal geometry. The main surface comprises corner areas at corners of the polygonal area. Each corner area extends at least 300 μm along the edges of the semiconductor substrate, beginning at the respective corners. Further, the electrical conductive structures are manufactured within the corner areas on the semiconductor substrate. All electrical conductive structures manufactured within the corner areas on the semiconductor substrate are electrically connected to the semiconductor substrate or electrically isolated so that in an operating state of the semiconductor device, each of the electrically conductive structures either comprises basically the same electric potential as the semiconductor substrate or is electrically floating.

Further, the semiconductor device may comprise one or more additional, optional features, realizing one or more aspects of the concepts described above.

In some embodiments, a semicondutor device comprises a semiconductor substrate comprising a main surface with a polygonal geometry. Further, means for performing a main electric function are manufactured within a main region on the semiconductor substrate. The main region extends over the main surface of the semiconductor substrate leaving open at least one corner area at a corner of the polygonal geometry of the main surface of the semiconductor substrate. The corner area extends at least 300 μm along the edges of the semiconductor substrate beginning at the corner.

Some embodiments relate to a power semiconductor device comprising a semiconductor device according to the concept described above or an embodiment described above. In this connection, at least one active element (e.g. a transistor) of the main electric circuit comprises a breakdown voltage higher than 10 V (or higher than 20 V, higher than 50 V, higher than 200 V or higher than 1000 V).

Some embodiments relate to a chip comprising a semiconductor device according to the described concept or an embodiment described above with at least one input interface (e.g. pad for receiving an input signal) and at least one output interface (e.g. pad for outputting an output signal) for the main electric circuit.

Figure 8:
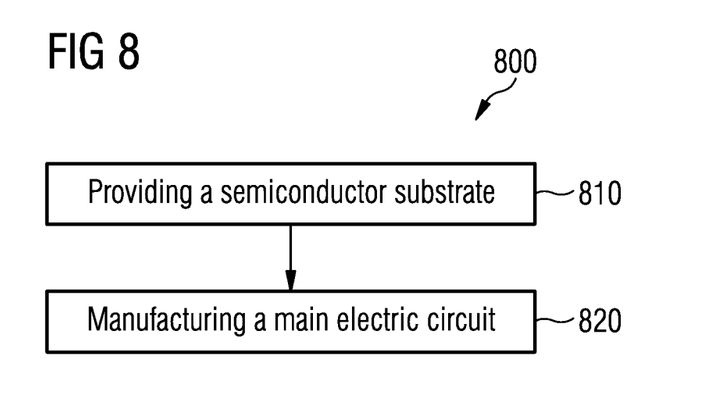
FIG. 8 shows a flowchart of a method for manufacturing a semiconductor device.

FIG. 8 shows a flowchart of a method 800 for manufacturing a semiconductor substrate according to an embodiment. The method 800 comprises providing a semiconductor substrate comprising a main surface with a polygonal geometry and manufacturing 820 a main electric circuit within a main region on the semiconductor substrate. The main electric circuit is operable to perform an electric main function. Further, the main region extends over the main surface of the semiconductor substrate leaving open at least one corner area at the corner of the polygonal geometry of the main surface of the semiconductor substrate. The corner area extends at least 300 μm along the edges of the semiconductor substrate beginning at the corner.

The method 800 may comprise one or more additional, optional steps, realizing in one or more aspects of the concept described above.

Some embodiments relate to chamfered chip corners for MOSFET structures for an immunization against cracks. In this connection, all (or some) possibly affected chip regions (e.g. the corners) may be designed electrically immune against entering cracks, in a way that these regions are set to the corresponding potential as the crack region. For example, all regions are set to the drain potential.

There may be the risk that a plurality of chips is affected by cracks in the corner area. A crack may be initially a lateral crack at the backside of the semiconductor substrate. A secondary crack may start at that initial point. The secondary crack may further propagate to the chip front side.

For example, it is suggested to chamfer the chip corners in an area of approximately 500 μm and leave this area open from electric structures (e.g. shown in FIG. 4).

However, leaving open these areas may disturb the homogeneity of the neighboring electrically active cell field areas (main region of the semiconductor substrate) during the different manufacturing processes (e.g. etching of trenches, polysilicon recess process), since the area (corner areas) may be relatively large, for example. Therefore, the areas left open (corner areas) may be realized as (almost) exact copies of a small cell field and/or small MOSFET areas, but short circuiting all potentials of this small MOSFET area with the drain contact (e.g. FIG. 5).

The active main MOSFET (or the main region of the semiconductor substrate) may be surrounded by a normal edge closing-off and a closed drain ring, for example. However, also the main MOSFET (as well as the corner area) may comprise a chamfered shape. The small MOSFET (within the corner area) may be completely short circuited in metal (within the metal layers) with a drain contact in the chip corner (corner area). Apart from that, it may be built up equal to the main MOSFET and provides a good homogeneity during the manufacturing processes mentioned above. Further, also the front end on-state resistance measurement (Ron*A) may be improved, since the corners implemented according to the described concept can be used for a sense measurement of the drain potential during the Ron measurement. This may provide significantly more accurate Ron measurement data, since without chamfer corners, the drain potential is tapped at a chuck. This method has an undefined additional contact resistance due to the pressing of the wafer to the chuck by a vacuum and falsifies the Ron measurement data in this way.

According to an aspect, the corner areas left open may be at least 300 μm to 500 μm large or extend over an area larger than 100000 μm$^2$ (or >750 μm left open or an area larger than 0.5 μm$^2$ per corner).

Cut out areas or areas left open (areas contained by the main region of the semiconductor surface) may also be possible at other positions of a chip (e.g. pad area or gate finger area). Also generally, areas in the range of 0.1 μm$^2$ to 0.5 μm$^2$ or even larger may be left open at stress critical areas.

Further, cut out areas or areas left open in chip (corner) areas may be realized with cell field similar drain contact structures electrically immunizing them against cracks. Cell field similar may also mean only one or few photo layers (e.g. photo technique trench). The drain contact structure may be generally also a contact structure to an arbitrary electric potential which may not disturb the MOSFET functionality under crack conditions, for example.

The corners left open may be used for large area MOSFETs (e.g. >25 mm$^2$, >20 mm$^2$ or >12 mm$^2$.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as magnetic disks and magnetic tapes, hard drives, or optically readable digital data storage media. The embodiments are also intended to cover computers programmed to perform said steps of the above-described methods or (field) programmable logic arrays ((F)PLAs) or (field) programmable gate arrays ((F)PGAs), programmed to perform said steps of the above-described methods.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for . . . " (performing a certain function) shall be understood as functional blocks comprising circuitry that is adapted for performing a certain function, respectively. Hence, a "means for s.th." may as well be understood as a "means being adapted or suited for s.th.". A means being adapted for performing a certain function does, hence, not imply that such means necessarily is performing said function (at a given time instant).

Functions of various elements shown in the figures, including any functional blocks labeled as "means", "means for performing an electric main function", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons. Furthermore, in some embodiments a single step may include or may be broken into multiple sub steps. Such sub steps may be included and part of the disclosure of this single step unless explicitly excluded.

What is claimed is:

1. A power semiconductor device comprising:
a semiconductor substrate comprising a main surface with a polygonal geometry; and
a main electric circuit manufactured within a main region on the semiconductor substrate, wherein the main electric circuit is operable to perform an electric main function, wherein at least one active element of the main electric circuit comprises a breakdown voltage higher than 10V,
wherein the main region extends over the main surface of the semiconductor substrate leaving open at least one corner area at a corner of the polygonal geometry of the main surface of the semiconductor substrate, wherein the corner area extends at least 300 µm along the edges of the semiconductor substrate beginning at the corner.

2. The power semiconductor device according to claim 1, wherein the main region extends over the main surface of the semiconductor substrate leaving open a corner area at every corner of the polygonal geometry of the main surface of the semiconductor substrate, wherein each corner area extends at least 300 µm along the edges of the semiconductor substrate beginning at the respective corners.

3. The power semiconductor device according to claim 1, wherein the at least one corner area extends at least over a triangle area, wherein the corner of the at least one corner area is a corner of the triangle and the edges of semiconductor substrate comprised by the at least one corner area are edges of the triangle.

4. The power semiconductor device according to claim 1, further comprising an electric test circuit manufactured within the at least one corner area on the main surface of the semiconductor substrate, wherein the electric test circuit is operable to enable an electrical test function.

5. The power semiconductor device according to claim 4, wherein the main electric circuit comprises at least one MOSFET structure and the electric test circuit comprises at least one MOSFET structure, wherein the MOSFET structure of the main electric circuit and the MOSFET structure of the electric test circuit are manufacturable simultaneously by the same manufacturing processes.

6. The power semiconductor device according to claim 4, wherein the electric test circuit is operable to enable an on-state resistance measurement of a device of the main electric circuit on the semiconductor substrate.

7. The power semiconductor device according to claim 1, further comprising an electric dummy structure manufactured within the at least one corner area on the main surface of the semiconductor substrate, wherein electrically conductive structures of the electric dummy structure are electrically connected to the semiconductor substrate or electrically isolated so that in an operating state of the power semiconductor device each of the electrically conductive structures of the electric dummy structure either comprise basically the same electric potential as the semiconductor substrate or is electrically floating, respectively.

8. The power semiconductor device according to claim 1, wherein all electrically conductive structures manufactured within the corner area on the semiconductor substrate are electrically connected to the semiconductor substrate or electrically isolated so that in an operating state of the power semiconductor device each of the electrically conductive structures either comprises basically the same electric potential as the semiconductor substrate or is electrically floating, respectively.

9. The power semiconductor device according to claim 1, wherein the main region and the at least one corner area comprise structures manufacturable by using at least a same trench etch process.

10. The power semiconductor device according to claim 1, wherein the main region and the at least one corner area comprise structures manufacturable by using at least a same trench oxidation process.

11. The power semiconductor device according to claim 1, wherein the main region and the at least one corner area comprise structures manufacturable by using at least a same polysilicon fill process.

12. The power semiconductor device according to claim 1, wherein the main region and the at least one corner area comprise at least one metal layer comprising a same metal occupancy density with a tolerance of less than 20% of a metal occupancy density of the main region.

13. The power semiconductor device according to claim 1, wherein the semiconductor substrate comprises a thickness of less than 120 µm.

14. The power semiconductor device according to claim 1, wherein the at least one corner area extends over more than 100000 µm².

15. The power semiconductor device according to claim 1, wherein the at least one corner area extends at least 500 µm along the edges of the semiconductor substrate beginning at the corner.

16. The power semiconductor device according to claim 1, wherein the main electric circuit is manufactured completely within the main region on the semiconductor substrate and is configured to use the semiconductor substrate as an electrode.

17. The power semiconductor device according to claim 16, wherein the semiconductor substrate represents a bulk electrode of at least one element of the main electric circuit or represents a drain electrode of at least one element of the main electric circuit.

18. The power semiconductor device according to claim 16, wherein an opposite surface of the main surface of the semiconductor substrate is configured to be used as a backside contact for at least one element of the main electric circuit.

19. The power semiconductor device according to claim 1, wherein the main electrical circuit comprises all elements manufactured on the semiconductor substrate necessary to provide the full functionality of the power semiconductor device in an operating state.

20. A method for manufacturing a power semiconductor device, the method comprising:
providing a semiconductor substrate comprising a main surface with a polygonal geometry; and
manufacturing a main electric circuit within a main region on the semiconductor substrate, wherein the main electric circuit is operable to perform an electric main function, wherein at least one active element of the main electric circuit comprises a breakdown voltage higher than 10V,
wherein the main region extends over the main surface of the semiconductor substrate leaving open at least one corner area at a corner of the polygonal geometry of the main surface of the semiconductor substrate, wherein the corner area extends at least 300 µm along the edges of the semiconductor substrate beginning at the corner.

* * * * *